(12) United States Patent
Gambino et al.

(10) Patent No.: US 7,883,916 B2
(45) Date of Patent: Feb. 8, 2011

(54) OPTICAL SENSOR INCLUDING STACKED PHOTOSENSITIVE DIODES

(75) Inventors: Jeffrey P. Gambino, Westford, VT (US); Daniel N. Maynard, Craftsbury Common, VT (US); Kevin N. Ogg, Burlington, VT (US); Richard J. Rassel, Essex Junction, VT (US); Raymond J. Rosner, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 301 days.

(21) Appl. No.: 12/129,714

(22) Filed: May 30, 2008

(65) Prior Publication Data
US 2009/0294812 A1 Dec. 3, 2009

(51) Int. Cl.
*H01L 21/00* (2006.01)
(52) U.S. Cl. .................. 438/48; 438/57; 438/116; 257/184; 257/233; 257/257; 257/291; 257/E25.032; 250/208.1; 250/370.08
(58) Field of Classification Search ........... None
See application file for complete search history.

(56) References Cited

U.S. PATENT DOCUMENTS 4,651,001 A * 3/1987 Harada et al. ............... 250/330
4,677,289 A * 6/1987 Nozaki et al. ............... 250/226
6,107,618 A * 8/2000 Fossum et al. ............ 250/208.1
2007/0091190 A1* 4/2007 Iwabuchi et al. ............ 348/294

* cited by examiner

*Primary Examiner*—Evan Pert
*Assistant Examiner*—Scott Wilson
(74) *Attorney, Agent, or Firm*—Scully, Scott, Murphy & Presser, P.C.

(57) ABSTRACT

A complementary metal-oxide-semiconductor (CMOS) image sensor comprises a first photosensitive diode comprising a first semiconductor material is formed in a first semiconductor substrate. A second photosensitive diode comprising a second semiconductor material, which has a different light detection wavelength range than the first semiconductor material, is formed in a second semiconductor substrate. Semiconductor devices for holding and detecting charges comprising a sensing circuit of the CMOS image sensor may also be formed in the second semiconductor substrate. The first semiconductor substrate and the second semiconductor substrate are bonded so that the first photosensitive diode is located underneath the second photosensitive diode. The vertical stack of the first and second photosensitive diodes detects light in the combined detection wavelength range of the first and second semiconductor materials. Sensing devices may be shared between the first and second photosensitive diodes.

20 Claims, 10 Drawing Sheets

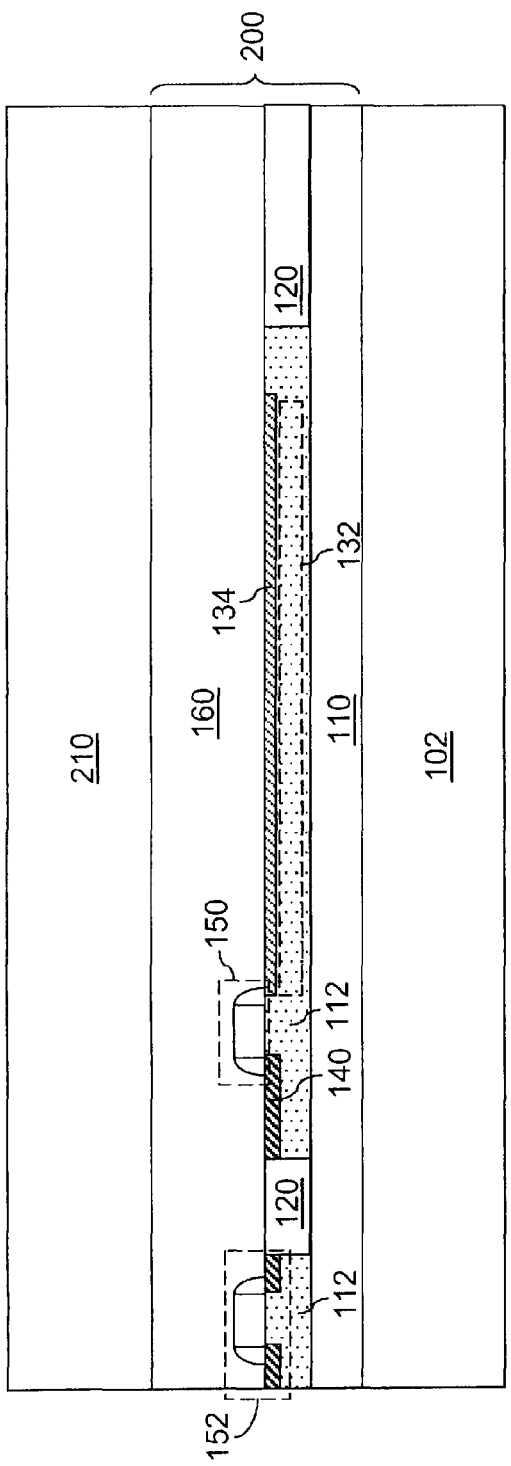
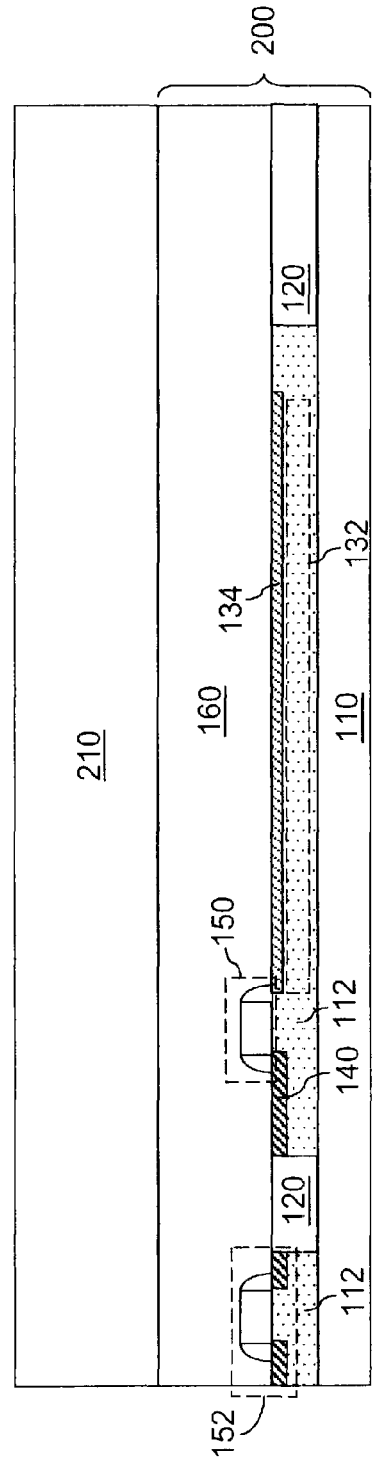

OPTICAL SENSOR INCLUDING STACKED PHOTOSENSITIVE DIODES

RELATED APPLICATIONS

The present application is related to co-pending U.S. application Ser. No. 12/129,716, which is incorporated herein by reference.

FIELD OF THE INVENTION

The present invention relates to semiconductor structures, and more particularly to semiconductor structures for an optical sensor which includes stacked photosensitive diodes, and methods of manufacturing the same, and circuits for the same.

BACKGROUND OF THE INVENTION

A pixel sensor comprises an array of pixel sensor cells that detects two dimensional signals. Pixel sensors include image sensors, which may convert a visual image to digital data that may be represented by a picture, i.e., an image frame. The pixel sensor cells are unit devices for the conversion of the two dimensional signals, which may be a visual image, into the digital data. A common type of pixel sensors includes image sensors employed in digital cameras and optical imaging devices. Such image sensors include charge-coupled devices (CCDs) or complementary metal oxide semiconductor (CMOS) image sensors.

While complementary metal oxide semiconductor (CMOS) image sensors have been more recently developed compared to the CCDs, CMOS image sensors provide an advantage of lower power consumption, smaller size, and faster data processing than CCDs as well as direct digital output that is not available in CCDs. Also, CMOS image sensors have lower manufacturing cost compared with the CCDs since many standard semiconductor manufacturing processes may be employed to manufacture CMOS image sensors. For these reasons, commercial employment of CMOS image sensors has been steadily increasing in recent years.

Prior art CMOS image sensors comprise a photosensitive diode including a p-n junction between two differently doped semiconductor regions. When a photon impinges on the photosensitive diode, the photosensitive diode may generate an electron-hole pair if the photon interacts with the band structure of the semiconductor material comprising the photosensitive diode. The energy of the photon that induces electron-hole pair generation depends on the band gap of the semiconductor material. The wider the band gap, the greater the energy of a photon that is required to generate an electron-hole pair. For example, the wavelength range of photons for photogeneration of an electron-hole pair is from about 190 nm to about 1,100 nm for silicon, from about 400 nm to about 1,700 nm for germanium, and from about 800 nm to about 2,600 nm for indium gallium arsenide, respectively. Practically, due to the loss of efficiency of photogeneration near the edge of the wavelength ranges, usable wavelength ranges for detection of light may be substantially narrower than the wavelength ranges described above for each semiconductor material.

The choice of the semiconductor material for the photosensitive diode determines the wavelength window for light detection for the prior art CMOS image sensors. For example, a prior art CMOS image sensor employing silicon in a photosensitive diode is capable of detecting light in the visible spectrum range. Likewise, a prior art CMOS image sensor employing germanium in a photosensitive diode is capable of detecting infrared light. Thus, the detection range of the prior art CMOS image sensor is limited to the wavelength range of the material employed in the photosensitive diode.

Some applications require, however, extended detection range that is beyond the range of wavelengths encompassed by a single semiconductor material. For example, optical sensors that require detection of visible wavelength spectrum range and infrared wavelength range cannot be provided either by a silicon based photosensitive diode or by a germanium based photosensitive diode.

In view of the above, there exists a need for a semiconductor structure including an optical sensor capable of detecting light over a wavelength range that extends beyond the detection range of a single semiconductor material, methods of manufacturing the same, and circuits for effecting the same.

SUMMARY OF THE INVENTION

The present invention provides a complementary metal-oxide-semiconductor (CMOS) image sensor structure that includes a vertical stack of two photosensitive diodes comprising different semiconductor materials and consequently having different light detection wavelength ranges, and methods of manufacturing the same, and circuits for effecting the same.

In the present invention, a complementary metal-oxide-semiconductor (CMOS) image sensor comprises a first photosensitive diode comprising a first semiconductor material is formed in a first semiconductor substrate. A second photosensitive diode comprising a second semiconductor material, which has a different light detection wavelength range than the first semiconductor material, is formed in a second semiconductor substrate. Semiconductor devices for holding and detecting charges comprising a sensing circuit of the CMOS image sensor may also be formed in the second semiconductor substrate. The first semiconductor substrate and the second semiconductor substrate are bonded so that the first photosensitive diode is located underneath the second photosensitive diode. The vertical stack of the first and second photosensitive diodes detects light in the combined detection wavelength range of the first and second semiconductor materials. Sensing devices may be shared between the first and second photosensitive diodes.

According to an aspect of the present invention, a method of forming a semiconductor structure is provided, which comprises:

forming a first photosensitive diode in a first semiconductor layer comprising a first semiconductor material in a first semiconductor substrate;

forming a second photosensitive diode in a second semiconductor layer comprising a second semiconductor material in a second semiconductor substrate, wherein the second semiconductor material is different from the first semiconductor material; and bonding the first semiconductor layer with the second semiconductor layer, wherein the second photosensitive diode overlies the first photosensitive diode after bonding.

In one embodiment, the method further comprises:

forming a first metal interconnect structure on the first semiconductor substrate prior to bonding; and forming a second metal interconnect structure on the second semiconductor layer after bonding.

In another embodiment, the method further comprises:

forming a first transfer transistor of integral construction with the first photosensitive diode and including a first floating drain in the first semiconductor layer; and forming a second transfer transistor of integral construction with the second photosensitive diode and including a second floating drain in the second semiconductor layer.

In yet another embodiment, the method further comprises:

forming a transfer transistor of integral construction of integral construction with one of the first photosensitive diode and the second photosensitive diode;

forming a binning transistor in a semiconductor layer containing the transfer transistor; and forming a conductive via extending from at least a bottom surface of the second semiconductor layer to at least a top surface of the first semiconductor layer, wherein the conductive via is a portion of an electrically conductive path between the binning transistor and the other of the first photosensitive diode and the second photosensitive diode.

According to another aspect of the present invention, a semiconductor circuit is provided, which comprises a parallel connection of a first device set and a second device set, wherein the first device set comprises a serial connection of a first photosensitive diode having a first detection wavelength range for photogeneration of charge carriers and a first field effect transistor, and wherein the second device set comprises a serial connection of a second photosensitive diode having a second detection wavelength range for photogeneration of charge carriers and a second field effect transistor, wherein a drain of the first field effect transistor and a drain of the second field effect transistor are electrically tied, wherein a node of the first photosensitive diode and a node of the second photosensitive diode are connected to electrical ground, and wherein the first detection wavelength range is different from the second detection wavelength range.

In one embodiment, the first wavelength range is from about 400 nm to about 1,700 nm, and the second wavelength range is from about 190 nm to about 1,100 nm.

In another embodiment, the semiconductor circuit further comprises a source follower transistor, wherein the drain of the first field effect transistor and the drain of the second field effect transistor are directly connected to a gate of the source follower transistor.

BRIEF DESCRIPTION OF THE DRAWINGS

FIGS. 2-4 show sequential vertical cross-sectional views of a second component structure of the exemplary semiconductor structure according to the present invention. FIG. 2 corresponds to a step after formation of a second dielectric layer 160. FIG. 3 corresponds to a step after bonding of a handle substrate 210. FIG. 4 corresponds to a step after removal of a bottom substrate layer 102.

DETAILED DESCRIPTION OF THE INVENTION

Figure 1:
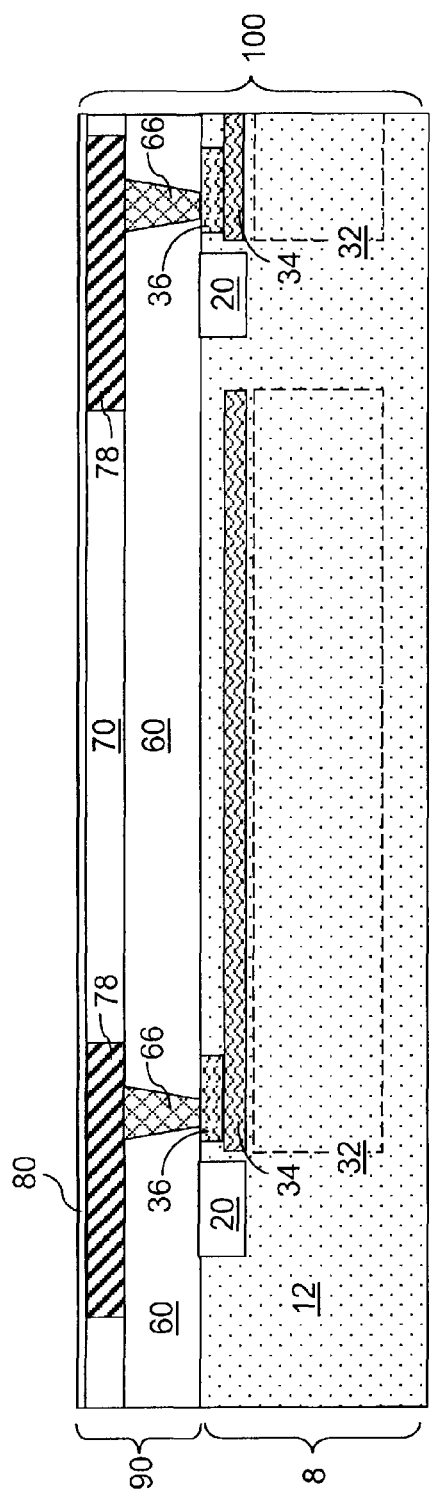
FIG. 1 shows vertical cross-sectional view of a first component structure 100 of an exemplary semiconductor structure according to the present invention.

As stated above, the present invention relates to semiconductor structures for an optical sensor which includes stacked photosensitive diodes, and methods of manufacturing the same, and circuits for the same. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Referring to FIG. 1, a first component structure 100 of an exemplary semiconductor structure according to the present invention comprises a first semiconductor substrate 8 and a first metal interconnect structure 90. The first semiconductor substrate 8 includes a first semiconductor layer 12, which comprises a first semiconductor material. First shallow trench isolation structures 20 comprising a dielectric material are formed in the first semiconductor substrate 12 by methods known in the art. The first semiconductor layer 12 has a doping of a first conductivity type, which may be p-type or n-type. Optionally, the first semiconductor substrate 8 may further include an underlying semiconductor layer (not shown), which has a doping of the first conductivity type and is located underneath the first semiconductor layer 12. The underlying semiconductor layer may comprise the same semiconductor material as, or a different semiconductor material from, the first semiconductor material. Typically, the dopant concentration of the underlying semiconductor layer 10, if present, is greater than the dopant concentration of the first semiconductor layer 12.

In the present invention, a lightly-doped semiconductor material denotes a semiconductor material having a dopant concentration less than or equal to $1.0\times10^{18}/cm^3$. A heavily-doped semiconductor material denotes a semiconductor material having a dopant concentration greater than $1.0\times10^{18}/cm^3$. A lightly-doped semiconductor layer denotes a layer of a lightly-doped semiconductor material. A heavily-doped semiconductor layer denotes a layer of a heavily-doped semiconductor material. The underlying semiconductor layer, if present, may comprise a heavily doped semiconductor material having the first conductivity type doping. Typically, the dopant concentration of the underlying semiconductor layer is from about $1.0\times10^{18}/cm^3$ to about $1.0\times10^{21}/cm^3$, and typically from about $1.0\times10^{19}/cm^3$ to about $1.0\times10^{20}/cm^3$.

Typically, the first semiconductor layer 12 comprises a lightly-doped semiconductor material having the first conductivity type doping. For example, the first semiconductor layer 12 may have a dopant concentration from about $1.0\times10^{14}/cm^3$ to about $1.0\times10^{18}/cm^3$, and typically from about $1.0\times10^{15}/cm^3$ to about $1.0\times10^{17}/cm^3$. The depth of the interface between the first semiconductor layer 12 and the underlying semiconductor layer, if the underlying semiconductor layer is present, is greater than mean free path of charge carriers in the first semiconductor layer 12, and may be from about 1 µm to about 10 µm, and typically from 2 µm to about 5 µm, although lesser and greater depths are also contemplated herein. The depth of the interface is greater than the depth of the bottom surface of the shallow trench isolation structures.

Non-limiting examples of the first semiconductor material include silicon, a silicon germanium alloy portion, silicon, germanium, a silicon-germanium alloy portion, a silicon carbon alloy portion, a silicon-germanium-carbon alloy portion, gallium arsenide, indium arsenide, indium gallium arsenide, indium phosphide, lead sulfide, other III-V compound semiconductor materials, and II-VI compound semiconductor materials. For example, germanium may be employed for the first semiconductor material. Preferably, the first semiconductor layer 12 is single crystalline, i.e., the first semiconductor material is epitaxially aligned atomically within the entirety of the first semiconductor layer 12.

Dopants of the second conductivity type are implanted into the first semiconductor layer 12 by masked ion implantation. A first charge collection well 34 having of doping of the second conductivity type is in the first semiconductor layer 12. The second conductivity type is the opposite type of the first conductivity type. For example, if the first conductivity type is p-type, the second conductivity type is n-type, and vice versa. The dopant concentration of the first charge collection well 34 may be from about $1.0 \times 10^{18}/cm^3$ to about $1.0 \times 10^{21}/cm^3$, and typically from about $1.0 \times 10^{19}/cm^3$ to about $1.0 \times 10^{20}/cm^3$, although lesser and greater dopant concentrations are also contemplated herein.

The depth of the first charge collection well 34, as measured from a top surface of the first semiconductor substrate 8 to a top surface of the first charge collection well 34, may be from about 50 nm to about 1,000 nm, and typically from about 100 nm to about 500 nm, although lesser and greater depths are contemplated herein also. Placement of the first charge collection well 34 underneath the top surface of the semiconductor substrate 8 reduces leakage current from the first charge collection well 34. Placement of the first charge collection well 34 away from the top surface of the first semiconductor substrate 8 is preferable, but not necessary to practice the present invention. Embodiment in which the first charge collection well 34 is formed directly underneath the top surface of the first semiconductor substrate 8 are also contemplated herein. The thickness of the first charge collection well 34 may be from about 100 nm to about 2,000 nm, and typically from about 200 nm to about 1,000 nm, although lesser and greater thicknesses are contemplated herein also.

A p-n junction is formed between the first charge collection well 34, which has a doping of the second conductivity type, and the portion of the first semiconductor layer 12 abutting the first charge collection well 34 since the first semiconductor layer 12 has a doping of the first conductivity type, which is the opposite of the second conductivity type. The portion of the first semiconductor layer 12 directly underneath the bottom surface of the first charge collection well 34 is herein referred to as a first semiconductor portion 32. Typically, the thickness of the first semiconductor portion 32 is the effective range for diffusion of charge carriers from the bottom of the first charge collection well 34. Typically, the thickness of the first semiconductor portion 32 may be from about 500 nm to about 5,000 nm, although lesser and greater thicknesses are contemplated herein also.

Depletion regions are formed in each of the first charge collection well 34 and the first semiconductor portion 32 around the p-n junction. The entirety of the first semiconductor portion 32 comprises the first semiconductor material and has a doping of the first conductivity type. The dopant concentration of the first semiconductor portion 32 is typically the same as the dopant concentration of the first semiconductor layer 12, e.g., $1.0 \times 10^{14}/cm^3$ to about $1.0 \times 10^{18}/cm^3$, and typically from about $1.0 \times 10^{15}/cm^3$ to about $1.0 \times 10^{17}/cm^3$, although lesser and greater concentrations are also contemplated herein.

A reachthrough region 36 is formed directly on the first charge collection well 34 if the top surface of the first charge collection well 34 is beneath the top surface of the first semiconductor layer 12. The reachthrough region has a doping of the second conductivity type, and may be formed by a masked ion implantation. The dopant concentration of the reachthrough region 36 may be from about $1.0 \times 10^{18}/cm^3$ to about $1.0 \times 10^{21}/cm^3$, and typically from about $1.0 \times 10^{19}/cm^3$ to about $1.0 \times 10^{20}/cm^3$, although lesser and greater dopant concentrations are also contemplated herein.

The first semiconductor portion 32 and the first charge collection well 34 collectively constitute a first photosensitive diode (32, 34) that generates electron-hole pairs upon illumination. Charge carriers of the second conductivity type are collected in the first charge collection well 34 in proportion to the amount of photons impinging into the first photosensitive diode (32, 34). In case the first conductivity type is p-type and the second conductivity type is n-type, electrons are collected in the first charge collection well 34. In case the second conductivity type is n-type and the second conductivity type is p-type, holes are collected in the first charge collection well 34. A photon impinging on the first photosensitive diode (32, 34) generates an electron-hole pair if the photon interacts with the semiconductor material in the first photosensitive diode (32, 34).

The energy of the photon that induces electron-hole pair generation depends on the band gap of the first semiconductor material. The wider the band gap, the greater the energy of a photon that is required to generate an electron-hole pair. For example, the wavelength range of photons for photogeneration of an electron-hole pair is from about 190 nm to about 1,100 nm for silicon, from about 400 nm to about 1,700 nm for germanium, and from about 800 nm to about 2,600 nm for indium gallium arsenide, respectively. A silicon germanium alloy has a narrower band gap than silicon, and the wavelength range for photogeneration of an electron-hole pair in a silicon germanium alloy is shifted toward longer wavelengths relative to the wavelength range for photogeneration of an electron-hole pair in silicon. Conversely, a silicon carbon alloy has a wider band gap than silicon, and the wavelength range for photogeneration of an electron-hole pair in a silicon carbon alloy is shifted toward shorter wavelengths relative to the wavelength range for photogeneration of an electron-hole pair in silicon. The wavelength range that induces photogeneration of an electron-hole pair in the first photosensitive diode (32, 34) is herein referred to as a first wavelength range. In one embodiment, the first semiconductor material is germanium and the first wavelength range is from about 400 nm to about 1,700 nm.

If the electron-hole pair is generated within the depletion region of the first photosensitive diode (32, 34), the charge carriers (holes and electrons) drift apart due to the kinetic energy imparted to the charge carriers during the photogeneration process. If a minority carrier (a charge carrier of the first conductivity type in the first charge collection well 34 or a charge carrier of the second conductivity type in the first semiconductor portion 32) enters into the depletion region by drifting, the electric field inherent in the depletion region of the first photosensitive diode (32, 34) sweeps the carrier across the p-n junction, which then becomes a majority carrier, i.e., a charge carrier of the first conductivity type in the first semiconductor portion 32 or a charge carrier of the second conductivity type in the first charge collection well 34, upon crossing the p-n junction, and producing a photocurrent if the circuit is closed, or accumulates charges. Particularly, if the carrier is a carrier of the second conductivity type, the carrier accumulates in the first charge collection well 34. The amount of charge that accumulates in the first charge collection well 34 is nearly linear to the number of incident photons (assuming the photons have the same energy distribution). If the minority carrier recombines with the majority carriers within the first photosensitive diode (32, 34) prior to entering the depletion region, the minority carrier is "lost" through recombination and no current or charge accumulation results.

A first via level dielectric layer 60 is formed by deposition of a dielectric material, which comprises an optically transparent dielectric material. Optical transparency as referred to in the description of the present invention refers to transparency for the purposes of light transmission for the wavelength of concern, which may include visible spectrum, infrared spectrum, and/or ultraviolet spectrum. A typical optically transparent dielectric material is silicon oxide including undoped silicate glass (USG) and various doped silicate glasses. In addition, any other optically transparent dielectric material may be employed for the first via level dielectric layer 60. The first via level dielectric layer 60 may be formed, for example, by chemical vapor deposition (CVD). The thickness of the first via level dielectric layer 60 may be from about 100 nm to about 2,000 nm, and typically from about 200 nm to about 1,000 nm, although lesser and greater thicknesses are contemplated herein.

First conductive vias 66 are formed in the first via level dielectric layer 60 by lithographic patterning of first via holes, followed by deposition of a conductive material and planarization.

A first line level dielectric layer 70 is formed by deposition of a dielectric material, which comprises an optically transparent dielectric material. The first line level dielectric layer 70 may comprise any material that may be employed for the first via level dielectric layer 60. Line troughs are lithographically formed in the first line level dielectric layer 70, followed by deposition of a conductive material and planarization to form first conductive lines 78. A dielectric cap layer 80 may be formed on the first conductive lines 78 and the first line level dielectric layer 70. Exemplary materials for the dielectric cap layer 80 include silicon nitride and silicon oxide. The first via level dielectric layer 60, the first conductive vias 66, the first line level dielectric layer 70, the first conductive lines 78, and the dielectric cap layer 80 collectively constitute the first metal interconnect structure 90.

Figure 2:
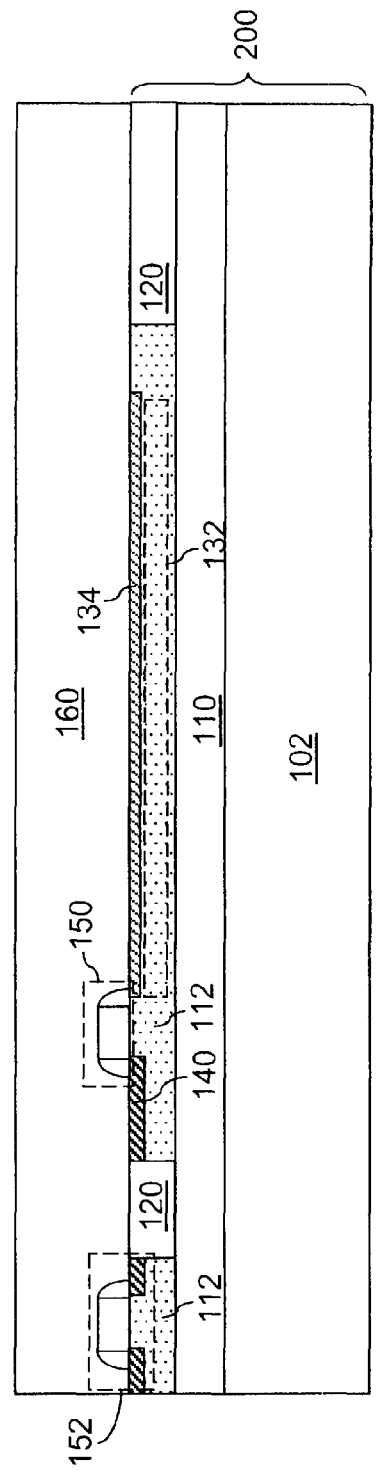

Referring to FIG. 2, a second component structure of the exemplary semiconductor structure of the present invention comprises a second semiconductor substrate 200 and semiconductor structures formed thereupon. The second semiconductor substrate 200 may be a semiconductor-on-insulator (SOI) substrate including a bottom substrate layer 102, a buried insulator layer 110, and a second semiconductor layer 112. The bottom substrate layer 102 may comprise a semiconductor material, a metallic material, a dielectric material, or a combination thereof. The buried insulator layer 110 comprises a dielectric material such as silicon oxide, silicon nitride, silicon oxynitride, corundum, any other dielectric material, or a combination thereof. The buried insulator layer 110 is optically transparent in the wavelength range employed for the purposes of the present invention, and specifically within at least a portion of the first wavelength range. The thickness of the buried insulator layer 110 may be from about 30 nm to about 1,000 nm, and typically from about 60 nm to about 5,000 nm, although lesser and greater thicknesses are contemplated herein.

Second shallow trench isolation structures 120 comprising a dielectric material are formed in the second semiconductor layer 112 by methods known in the art. The second semiconductor layer 112 comprises a second semiconductor material. The second semiconductor layer 112 may have a doping of the first conductivity type or a doping of the second conductivity type. The thickness of the second semiconductor layer 112 may be from about 100 nm to about 5,000 nm, and typically from about 200 nm to about 2,000 nm, although lesser and greater thicknesses are contemplated herein also.

The second semiconductor material may be a lightly-doped semiconductor material, i.e., doped at a dopant concentration from about $1.0 \times 10^{14}/cm^3$ to about $1.0 \times 10^{18}/cm^3$, and typically from about $1.0 \times 10^{15}/cm^3$ to about $1.0 \times 10^{17}/cm^3$. Non-limiting examples of the second semiconductor material include silicon, a silicon germanium alloy portion, silicon, germanium, a silicon-germanium alloy portion, a silicon carbon alloy portion, a silicon-germanium-carbon alloy portion, gallium arsenide, indium arsenide, indium gallium arsenide, indium phosphide, lead sulfide, other III-V compound semiconductor materials, and II-VI compound semiconductor materials.

The second semiconductor material is a different material from the first semiconductor material. Particularly, the second semiconductor material has a second band gap, which is different from the band gap of the first semiconductor material, which is herein referred to as a first band gap. Due to the differences in the band gap, the wavelength range in which the second semiconductor material reacts to light for the purposes of photogeneration, which is herein referred to as a second wavelength range, is different from the first wavelength range.

In one embodiment, germanium may be employed for the first semiconductor material and silicon may be employed for the second semiconductor material. Preferably, the second semiconductor layer 112 is single crystalline, i.e., the second semiconductor material is epitaxially aligned atomically within the entirety of the second semiconductor layer 112.

Gate electrodes and source and drain regions are formed in the second semiconductor layer 112 by methods known in the art. One of the gate electrodes formed on the second semiconductor layer 112 is a transfer gate electrode 150. A floating drain region 140 is formed in the second semiconductor layer by masked implantation of dopants of the opposite conductivity type than the conductivity type of the second semiconductor layer 112. For example, the second semiconductor layer 112 may have a p-type doping and the floating drain region 140 may have an n-type doping, or vice versa. The doping type of the floating drain region 140 may be the first conductivity type or the second conductivity type.

Further, dopants of the opposite conductivity type to the doping type of the second semiconductor layer 112 are implanted into the second semiconductor layer 112 by masked ion implantation to form a second charge collection well 134. The second charge collection well 134 has a doping of the opposite conductivity type to the doping type of the second semiconductor layer 112. For example, if the second semiconductor layer 112 has a p-type doping, the second charge collection well 134 has an n-type doping, and vice versa. The dopant concentration of the second charge collection well 134 may be from about $1.0 \times 10^{18}/cm^3$ to about $1.0 \times 10^{21}/cm^3$, and typically from about $1.0 \times 10^{19}/cm^3$ to about $1.0 \times 10^{20}/cm^3$, although lesser and greater dopant concentrations are also contemplated herein. The thickness of the second charge collection well 134 may be from about 50 nm to about 2,000 nm, and typically from about 100 nm to about 1,000 nm, although lesser and greater thicknesses are contemplated herein also.

A p-n junction is formed between the second charge collection well 134 and the portion of the second semiconductor layer 112 abutting the second charge collection well 134. The portion of the second semiconductor layer 112 directly underneath the bottom surface of the second charge collection well 134 is herein referred to as a second semiconductor portion 132. Typically, the thickness of the second semiconductor portion 132 is the effective range for diffusion of charge carriers from the bottom of the second charge collection well 134. Typically, the thickness of the second semiconductor portion 132 may be from about 500 nm to about 5,000 nm, although lesser and greater thicknesses are contemplated herein also.

Depletion regions are formed in each of the second charge collection well 134 and the second semiconductor portion 132 around the p-n junction. The entirety of the second semiconductor portion 132 comprises the second semiconductor material. The dopant concentration of the second semiconductor portion 132 is typically the same as the dopant concentration of the second semiconductor layer 112, e.g., $1.0 \times 10^{14}/cm^3$ to about $1.0 \times 10^{18}/cm^3$, and typically from about $1.0 \times 10^{15}/cm^3$ to about $1.0 \times 10^{17}/cm^3$, although lesser and greater concentrations are also contemplated herein.

The second semiconductor portion 132 and the second charge collection well 134 collectively constitute a second photosensitive diode (132, 134) that generates electron-hole pairs upon illumination. Charge carriers of the of the same conductivity type as the doping type of the second charge collection well 134 are collected in the second charge collection well 134 in proportion to the amount of photons impinging into the second photosensitive diode (132, 134). In case the second charge collection well 134 has an n-type doping, electrons are collected in the second charge collection well 134. In case the second charge collection well 134 has a p-type doping, holes are collected in the second charge collection well 134. A photon impinging on the second photosensitive diode (132, 134) generates an electron-hole pair if the photon interacts with the semiconductor material in the second photosensitive diode (132, 134).

The energy of the photon that induces electron-hole pair generation depends on the band gap of the second semiconductor material. The wider the band gap, the greater the energy of a photon that is required to generate an electron-hole pair. Since the first band gap and the second band gap are different, the energy range of photon and the corresponding wavelength range of the photon for photogeneration are different between the first photosensitive diode (32, 34) and the second photosensitive diode (132, 134). Photogeneration of an electron-hole pair in the second photosensitive diode (132, 134) is induced only in the second wavelength range, which is different from the first wavelength range. In one embodiment, the first semiconductor material is germanium and the first wavelength range is from about 400 nm to about 1,700 nm, and the second semiconductor material is silicon and the second wavelength range is from about 190 nm to about 1,100 nm.

The operating principle of the second photosensitive diode (132, 134) is the same as the operating principle of the first photosensitive diode (32, 34).

The floating drain region 140, the second charge collection well 134, and the transfer gate electrode 150 collectively constitute a transfer transistor. The second charge collection well 134 is also a source region of the transfer transistor. Thus, the source region of the transfer transistor and the second charge collection well 134 are the same, and thus are integrally formed, i.e., of unitary construction. At least one field effect transistor 152 may be formed on the second semiconductor layer 112. The at least one field effect transistor 152 may be employed to form a complementary metal-oxide-semiconductor (CMOS) image sensor cell circuitry.

A second dielectric layer 160 is formed by deposition of a dielectric material, which comprises an optically transparent dielectric material. A typical optically transparent dielectric material is silicon oxide including undoped silicate glass (USG) and various doped silicate glasses. In addition, any other optically transparent dielectric material may be employed for the second dielectric layer 160. The second dielectric layer 160 may be formed, for example, by chemical vapor deposition (CVD). The thickness of the second dielectric layer may be from about 100 nm to about 2,000 nm, and typically from about 200 nm to about 1,000 nm, although lesser and greater thicknesses are contemplated herein.

Referring to FIG. 3, a handle substrate 210 is added to the second component structure of the present invention by bonding to the top surface of the second dielectric layer 160. The handle substrate 210 may comprise a semiconductor material, a metallic material, a dielectric material, or a combination thereof. The bonding may be effected by methods known in the art for promoting adhesion between two adjoining layers. The handle substrate 210 is thick enough to provide sufficient mechanical strength for handling after subsequent removal of the bottom substrate layer 102. The thickness of the handle substrate 210 may be from about 100 μm to about 2,000 μm, and typically from about 300 μm to about 1,000 μm, although lesser and greater thicknesses are contemplated herein also.

Referring to FIG. 4, the bottom substrate layer 102 is removed from the second component structure of the present invention. The removal of the bottom substrate layer 102 may be effected by methods known in the art including, for example, mechanical grinding, chemical mechanical polishing, chemical etching, cleaving, or a combination thereof. In case cleaving is employed, a cleaving layer may be formed by methods known in the art including ion implantation of cleavage promoting species such as hydrogen. Preferably, the bottom surface of the buried insulator layer 110 is exposed. The bottom surface of the buried insulator layer 110 may be polished to provide a smooth surface in preparation for a second bonding to be subsequently performed.

Figure 5:
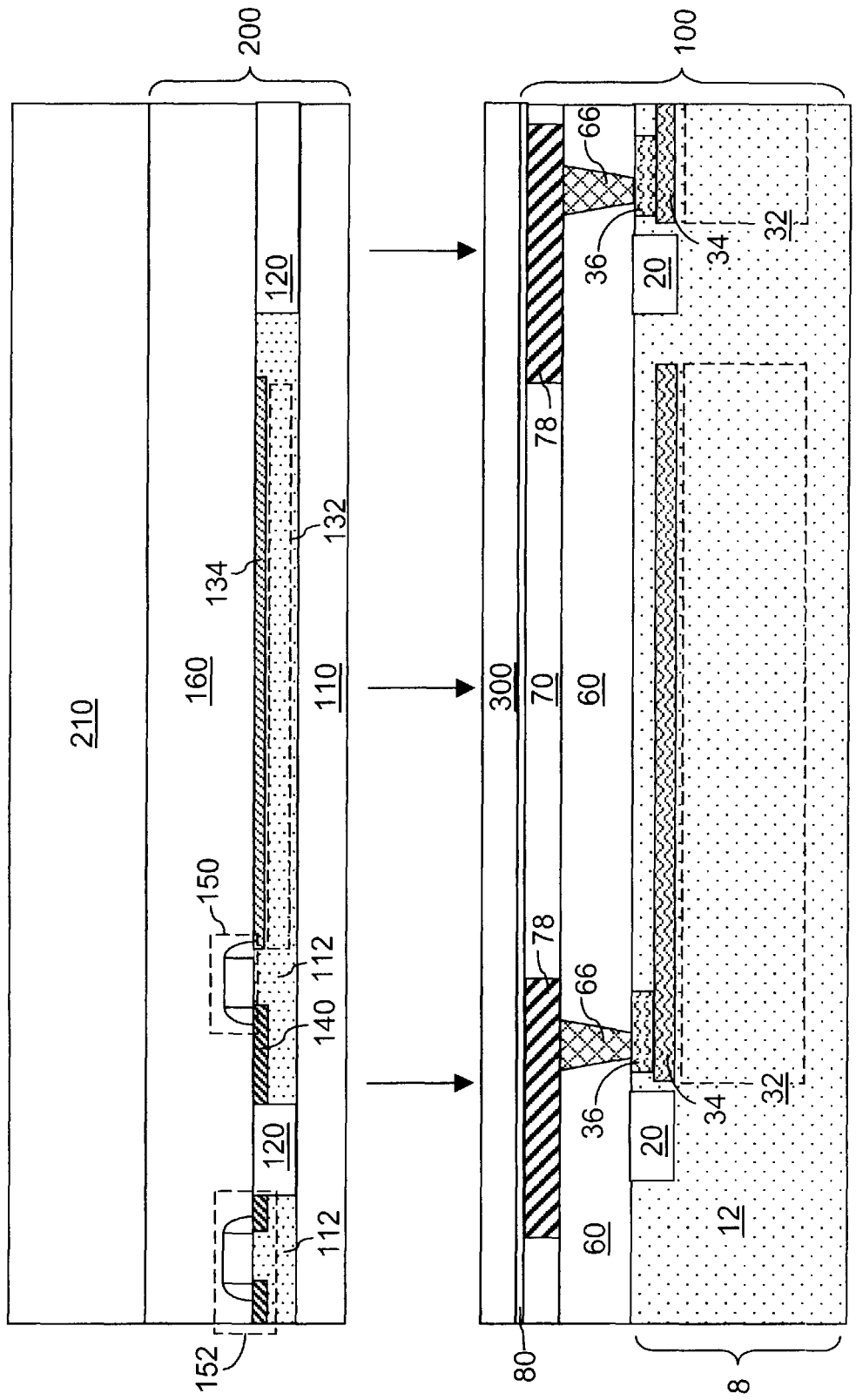
FIG. 5 shows a vertical cross-sectional view of the exemplary semiconductor structure at a bonding step between the first component structure 100 and the second component structure 200.

Referring to FIG. 5, the second component structure is bonded to the first component structure. Optionally, an adhesion promoting dielectric layer 300 may be applied between the top surface of the first component structure 100 and the bottom surface of the second component structure. The adhesion promoting dielectric layer 300 is optically transparent within the first wavelength range. The adhesion promoting dielectric layer 300 may comprise silicon oxide or a polymer such as benzocyclobutene (BCB, $C_8H_8$). The thickness of the adhesion promoting dielectric layer 300 may be from about 10 nm to about 1,000 nm, and typically from about 50 nm to about 3,000 nm, although lesser and greater thicknesses are contemplated herein also. Elevated temperature and/or compressive pressure at the interface may be employed to bond the second component structure to the first component structure with, or without, the adhesion promoting layer 300 therebetween. The second component structure is aligned over the first component structure so that the first photosensitive diode (32, 34) is located underneath the area of the second photosensitive diode (132, 134). The assembly of the second component structure (200, 210), the first component structure 100, and the adhesion promoting dielectric layer 300, if present, is collectively referred to as the exemplary semiconductor structure herebelow.

Figure 6:
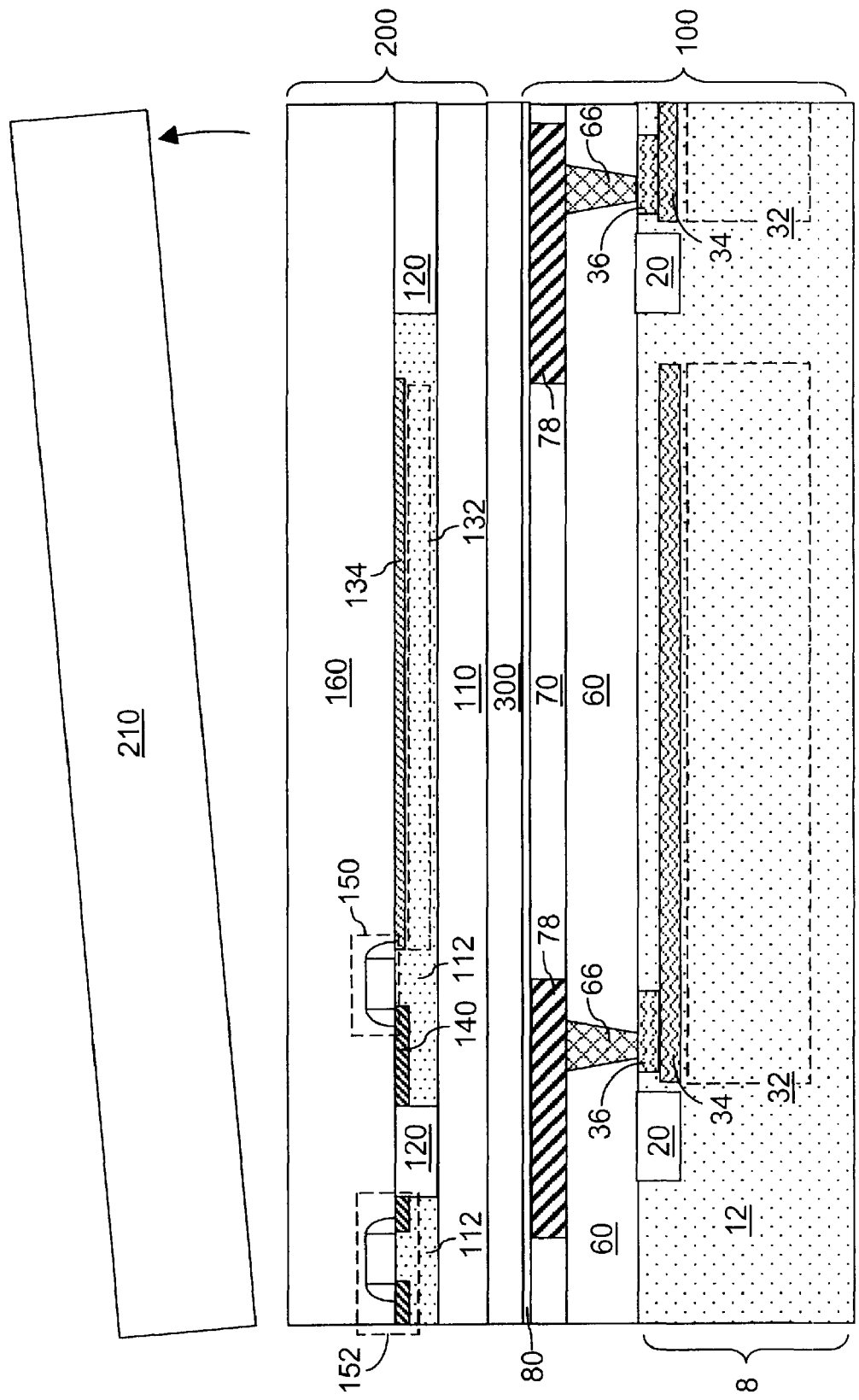
FIG. 6 shows a vertical cross-sectional view of the exemplary semiconductor structure at a cleaving step.
Figure 7:
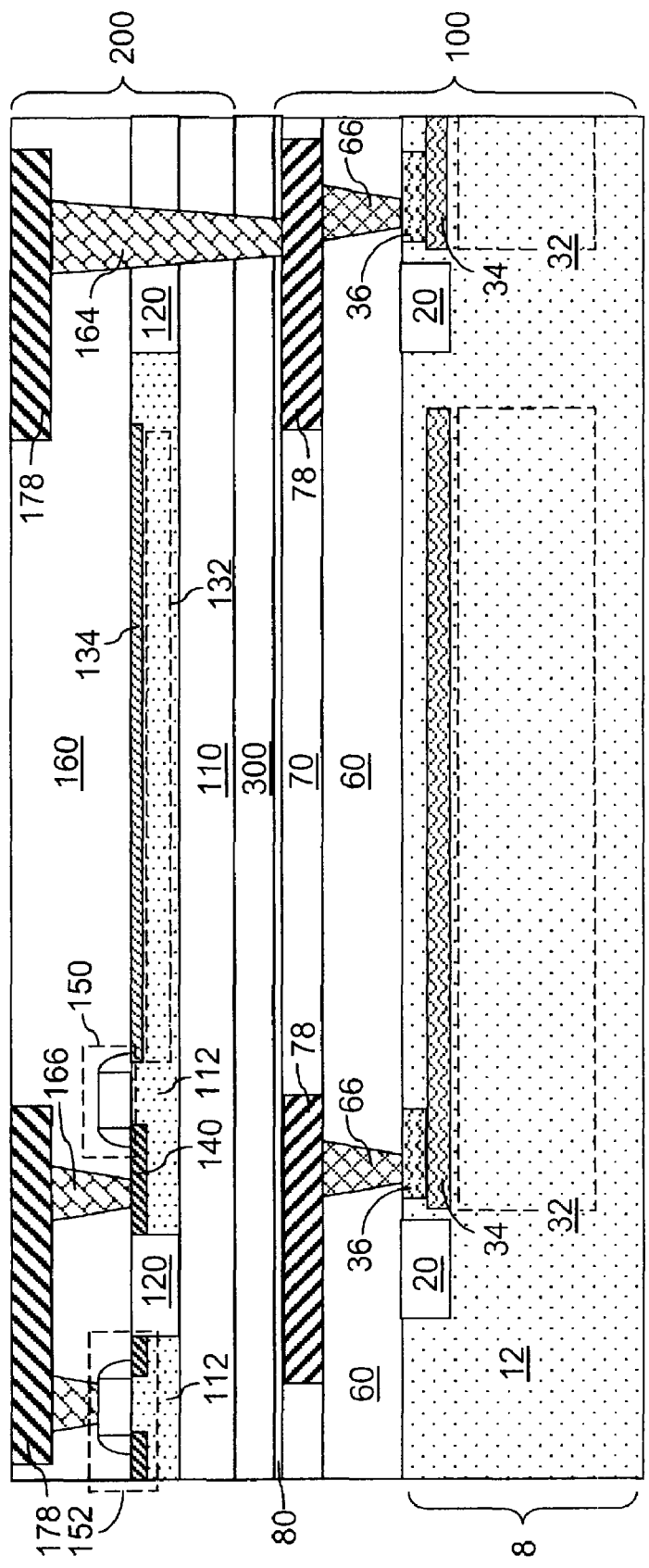
FIG. 7 shows a vertical cross-sectional view of the exemplary semiconductor structure after formation of second metal interconnect structure.

Referring to FIG. 6, the handle substrate 210 is removed from the exemplary semiconductor structure employing methods in the art, including, for example, mechanical grinding, chemical mechanical polishing, chemical etching, cleaving, or a combination thereof. In case cleaving is employed, a cleaving layer may be formed by methods known in the art including ion implantation of cleavage promoting species such as hydrogen. A top surface of the second dielectric layer 160 is exposed, which may be polished or planarized as needed.

Figure 8:
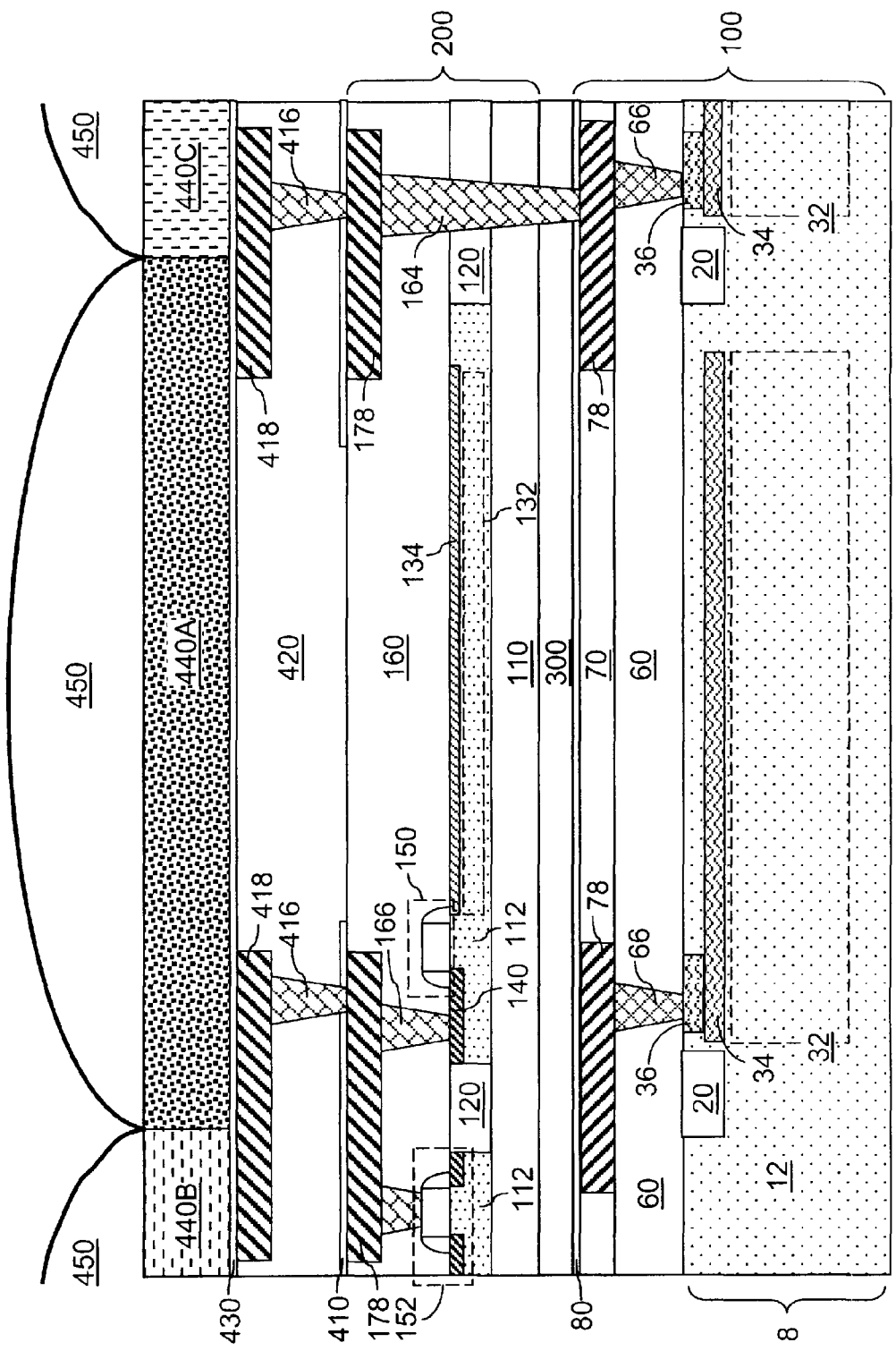
FIG. 8 shows a vertical cross-sectional view of the exemplary semiconductor structure after formation of color filters and optical lenses.

Referring to FIG. 8, second via holes of a first type that reaches down to semiconductor structures located in the second dielectric layer 160 or on the second semiconductor layer 112 are formed in the second dielectric layer 160 by lithographic means and a pattern transfer into the second dielectric layer 160. In addition, second via holes of a second type that extends through the second dielectric layer 160, a portion of the second shallow trench isolation structure 120, the buried insulator layer 110, the adhesion promoting dielectric layer 300, if present, and the dielectric cap layer 80 and exposes a top surface of the first conductive lines 78 are formed by lithographic means and a pattern transfer, for example, by an anisotropic etch. Further, line troughs may be formed in the upper portion of the second dielectric layer.

Second conductive vias 166, at least one conductive structure 164, and second conductive lines 178 are formed in the second dielectric layer 160 by deposition of a conductive material and planarization. The at least one conductive structure 164 may be a conductive via that extends from the top surface of one of the first conductive lines 78 to the bottom surface of one of the second conductive lines 178. The second conductive vias 166, at least one conductive structure 164, and second conductive lines 178 may be formed simultaneously in a dual damascene processing scheme, or in at least two stages, for example, by employing a single damascene processing scheme.

Further, the second dielectric layer 160, the buried insulator layer 110, the adhesion promotion dielectric layer 300, and the dielectric cap layer 80, the first line level dielectric layer 70, and the first via level dielectric layer 60 are optically transparent in at least a portion of the first wavelength range, and preferably within the entirety of the first wavelength range. Since the first band gap is different from the second band gap and the first wavelength range is different from the second wavelength range, the second semiconductor material of the second photosensitive diode (132, 134) is optically transparent at least within a portion of the first wavelength range. In case the first semiconductor material is germanium and the first wavelength range is from about 400 nm to about 1,700 nm and the second semiconductor material is silicon and the second wavelength range is from about 190 nm to about 1,100 nm, the second photosensitive diode (132, 134) is transparent at least in the wavelength range from about 1,100 nm to about 1,700 nm. Practically, due to inherent inefficiency of photogeneration near the edge of the second wavelength range, the range of wavelength over which the second photosensitive diode (132, 134) is substantially transparent may extend below 1,100 nm. Thus, a transparent optical path is provided for a wavelength range that includes at least a portion of the first wavelength range between the second dielectric layer 160 and the first photosensitive diode (132, 134).

Figure 9:
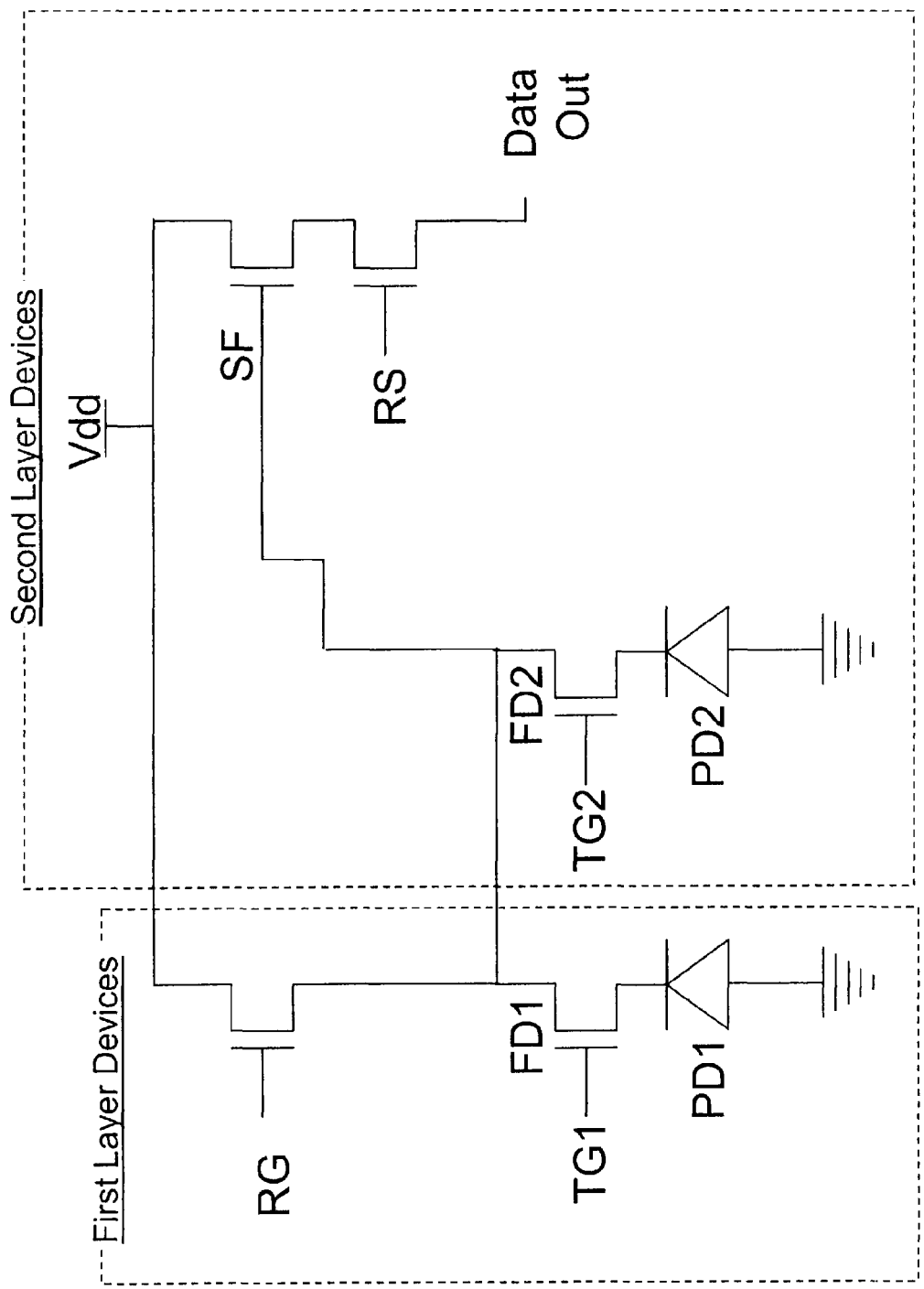
FIGS. 9-11 show first, second, and third exemplary semiconductor circuits, respectively, according to the present invention.

Referring to FIG. 9, a first level dielectric cap layer 410 and a third dielectric layer 420 are formed over the second dielectric layer 160. The first level dielectric cap layer 410 may comprise a dielectric material that promotes adhesion of materials, suppresses electromigration, and/or provides protection against diffusion of impurities such as oxygen, moisture, and metallic impurities. For example, the first level dielectric cap layer 410 may comprise silicon nitride. Typically, the first level dielectric cap layer 410 is removed from above the area of the first photosensitive diode (32, 34) and the second photosensitive diode (132, 134).

The third dielectric layer 420 comprises an optically transparent dielectric material. The third dielectric layer 420 may comprise any of the material that may be employed for the first via level dielectric layer 60 or the first line level dielectric layer 70. Third conductive vias 416 and third conductive lines 418 are formed in the third dielectric layer 60 in a manner similar to the formation of the second conductive vias 166 and second conductive lines 178.

A second level dielectric cap layer 430 may be formed on the third conductive lines 418 and the third dielectric layer 420. Exemplary materials for the second level dielectric cap layer 430 include silicon nitride and silicon oxide.

While the present invention is described with two levels of metal interconnect structures, as many levels of metal interconnect structures may be formed as needed. Such variations are explicitly contemplated herein.

Optionally, color filters may be formed on the metal interconnect structures. The color filters may limit the detection wavelength range for the first photosensitive diode (32, 34) and/or for the second photosensitive diode (132, 134). Different color filters may be employed to alter wavelength range sensitivity of each pair of vertically stacked photosensitive diodes (32, 34, 132, 134). For illustration, the exemplary semiconductor structure includes a first color filter 440A, a second color filter 440B, and a third color filter 440C. Each color filter is located in an optical path that extends to a pair of vertically stacked photosensitive diodes (32, 34, 132, 134) located underneath.

Optionally, optical lenses 450 may be formed on the metal interconnect structures instead of, or in conjunction with, the color filters. The optical lenses 450 may be formed above, or beneath, the color filters. The optical lenses 450 help focus incident light on the first photosensitive diode (32, 34) and the second photosensitive diode (132, 134). Each optical lens 450 is located in an optical path that extends to a pair of vertically stacked photosensitive diodes (32, 34, 132, 134) located underneath.

Referring to FIG. 9, a first exemplary semiconductor circuit according to the present invention comprises a first group of devices labeled "first layer devices" and a second group of devices labeled "second layer devices." In a first embodiment, the first layer devices may be formed in or on the first semiconductor layer 12 of FIG. 8 employing the first semiconductor material, and the second layer devices may be formed in or on the second semiconductor layer 112 of FIG. 8 employing the second semiconductor material. In a second embodiment, the first layer devices may be formed in or on the second semiconductor layer 112 of FIG. 8 employing the second semiconductor material, and the second layer devices may be formed in or on the first semiconductor layer 12 of FIG. 8 employing the first semiconductor material. While the present invention is described for the first embodiment, practice of the second embodiment of the present invention is straightforward, and is explicitly contemplated herein.

The first exemplary semiconductor circuit comprises a parallel connection of a first device set and a second device set. The first device set comprises a serial connection of a first photosensitive diode PD1 having a first detection wavelength range for photogeneration of charge carriers and a first field effect transistor, which is a first transfer gate transistor TG1. The second device set comprises a serial connection of a second photosensitive diode PD2 having a second detection wavelength range for photogeneration of charge carriers and a second field effect transistor, which is a second transfer gate transistor TG2. The drain of the first transfer transistor TG1 and the drain of the second transfer transistor TG2 are electrically tied. A node of the first photosensitive diode PD1, which corresponds to the first semiconductor portion 32 in the exemplary semiconductor structure in FIG. 8, and a node of the second photosensitive diode PD2, which corresponds to the second semiconductor portion 132 in the exemplary semiconductor structure in FIG. 8, are connected to electrical ground.

The first exemplary semiconductor circuit displays an optically dependent circuit response. The first photosensitive diode PD1 and the second photosensitive diode PD2 have different optical characteristics. Specifically, the first detection wavelength range, which is the effective range of light wavelength within which the first photosensitive diode PD1 generates charges, is different from the second wavelength detection range. For example, the first photosensitive diode PD1 may be implemented in a first semiconductor layer 12 of the exemplary semiconductor structure in FIG. 8, corresponding to the first detection wavelength range from about 400 nm to about 1,700 nm, and the second photosensitive diode PD2 may be implemented in a second semiconductor layer 112 of the exemplary semiconductor structure in FIG. 8, corresponding to the second detection wavelength range from about 190 nm to about 1,100 nm.

Physical structures corresponding to the first photosensitive diode PD1, the first transfer transistor TG1 and the reset gate transistor may be formed in the first semiconductor layer 12 of the exemplary semiconductor structure in FIG. 8. The first transfer transistor TG1 includes a first floating drain FD1, which is the drain of the first transfer transistor TG1. The first photosensitive diode PD1 of the first exemplary semiconductor circuit may be physically implemented as the first photosensitive diode (32, 34) of the exemplary semiconductor structure in FIG. 8, which includes the first charge collection well 32 and the first semiconductor portion 34. The physical implementation of the first photosensitive diode PD1 may be integrally formed with the physical implementation of the first transfer transistor TG1 such that the first charge collection well 32 is also the source region of the physical implementation of the first transfer transistor.

A physical structure corresponding to the reset gate transistor RG is formed in the first semiconductor layer 12 of the exemplary semiconductor structure in FIG. 8. One of the drain of the reset gate transistor RG and the source of the reset gate transistor RG, depending on what type of field effect transistor the reset gate transistor RG is, is connected to the drain of the first transfer transistor TG1 and the drain of the second transfer transistor TG2. The other of the drain of the reset gate transistor RG and the source of the reset gate transistor RG is connected to a power supply source Vdd.

The first exemplary semiconductor circuit further comprises a source follower transistor SF. The drain of the first transfer transistor TG1 and the drain of the second transfer transistor TG2 are directly connected to a gate of the source follower transistor SF. The first exemplary semiconductor circuit further comprises a row select transistor RS in a series connection with the source follower transistor SF. One of a source of the source follower transistor SF and a drain of the source follower transistor SF is connected to a source or a drain of the row select transistor RS. The other of the source of the source follower transistor SF and the drain of the source follower transistor SF is connected to the power supply source Vdd.

Figure 10:
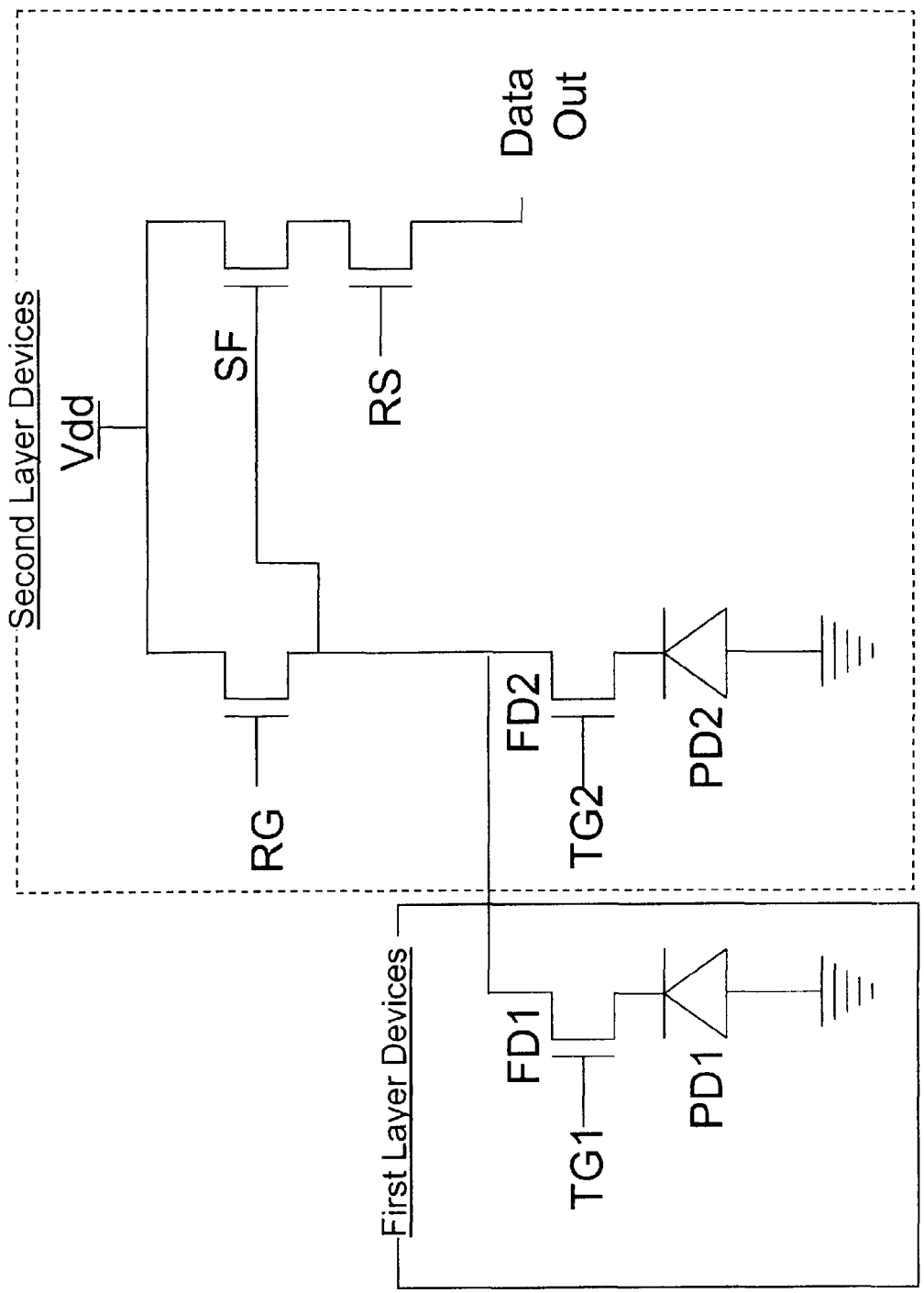

Referring to FIG. 10, a second exemplary semiconductor circuit according to the present invention is derived from the first exemplary semiconductor circuit by modification of the configuration of the reset gate transistor RG. As in the first exemplary semiconductor circuit, the second exemplary semiconductor circuit comprises a first group of devices labeled "first layer devices" and a second group of devices labeled "second layer devices" as in the first exemplary semiconductor circuit. As in the implementation of first exemplary semiconductor circuit, the first layer devices may be formed in or on the first semiconductor layer 12 of FIG. 8 employing the first semiconductor material, and the second layer devices may be formed in or on the second semiconductor layer 112 of FIG. 8 employing the second semiconductor material. Alternately, the first layer devices may be formed in or on the second semiconductor layer 112 of FIG. 8 employing the second semiconductor material, and the second layer devices may be formed in or on the first semiconductor layer 12 of FIG. 8 employing the first semiconductor material. While the present invention is described for the first embodiment, practice of the second embodiment of the present invention is straightforward, and is explicitly contemplated herein.

In contrast with the first exemplary semiconductor circuit, the reset gate transistor RG belongs to the second group of devices instead of belonging to the first group of devices. Depending on the selection of the first semiconductor material and the second semiconductor material, such rearrangement may result in improvement in circuit performance.

Figure 11:
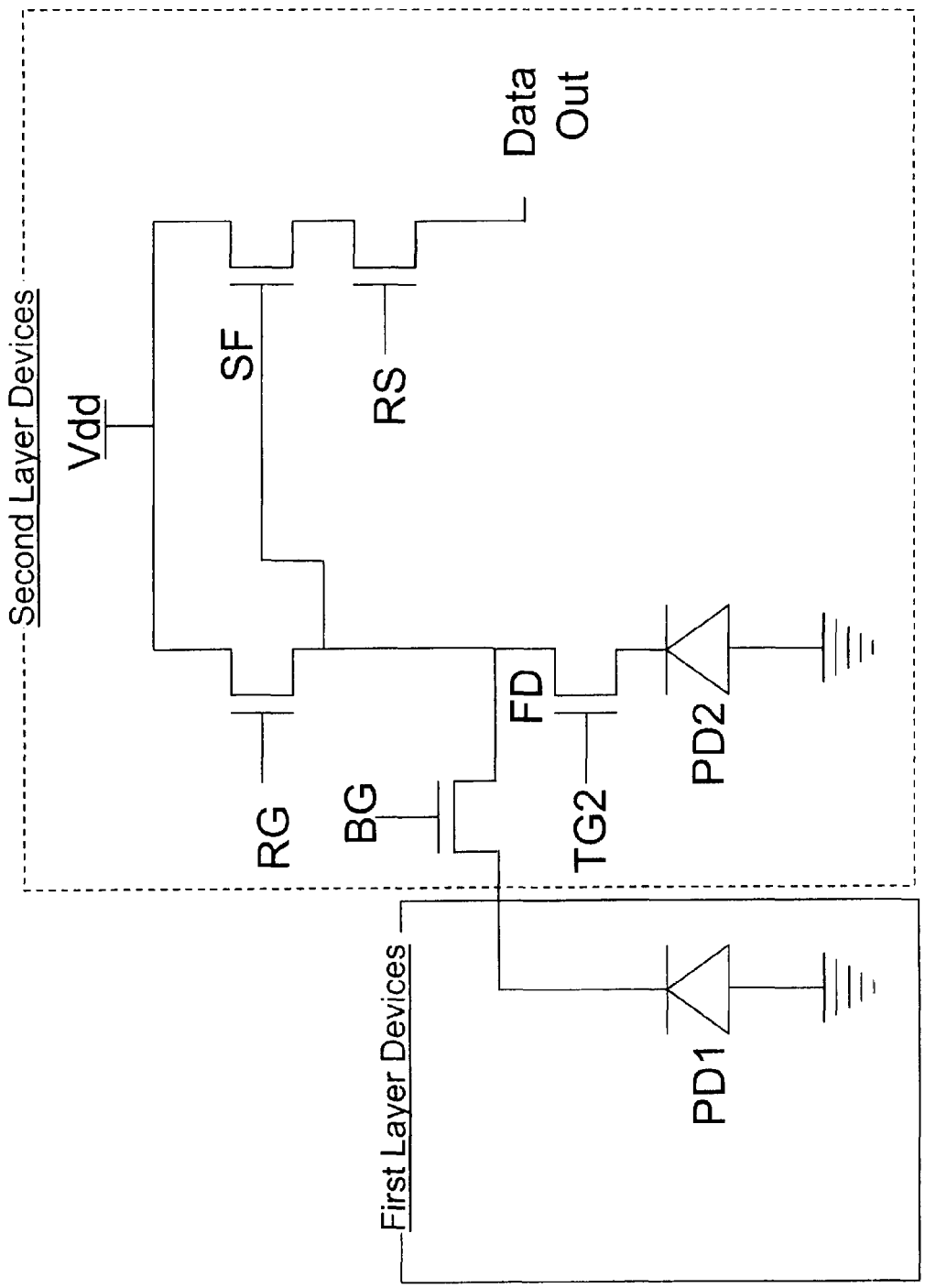

Referring to FIG. 11, a third exemplary semiconductor circuit according to the present invention is derived from the second exemplary semiconductor circuit by replacing the first transfer transistor TG1 belonging to the first group of devices with a binning transistor BG belonging to the second group of devices. Combined with the first transfer transistor TG1, the binning transistor BG functions as a switch, or a binning device, that determines the origin of electrical charges to be stored in the floating drain FD. As in the first exemplary semiconductor circuit, the third exemplary semiconductor circuit comprises a first group of devices labeled "first layer devices" and a second group of devices labeled "second layer devices" as in the first exemplary semiconductor circuit. As in the implementation of first exemplary semiconductor circuit, the first layer devices may be formed in or on the first semiconductor layer 12 of FIG. 8 employing the first semiconductor material, and the second layer devices may be formed in or on the second semiconductor layer 112 of FIG. 8 employing the second semiconductor material. For example, the only physical implementation of the third exemplary semiconductor circuit to be formed in the first semiconductor layer 12 in the exemplary semiconductor structure of FIG. 8 is the first photosensitive diode (32, 34) of FIG. 8. Depending on the selection of the first semiconductor material and the second semiconductor material, such rearrangement may result in improvement in circuit performance. Alternately, the first layer devices may be formed in or on the second semiconductor layer 112 of FIG. 8 employing the second semiconductor material, and the second layer devices may be formed in or on the first semiconductor layer 12 of FIG. 8 employing the first semiconductor material. While the present invention is described for the first embodiment, practice of the second embodiment of the present invention is straightforward, and is explicitly contemplated herein.

A common floating drain is formed for the second transfer transistor TG2 and the binning transistor BG. The third exemplary semiconductor circuit comprises a parallel connection of a first device set and a second device set. The first device set comprises a serial connection of a first photosensitive diode PD1 having a first detection wavelength range for photogeneration of charge carriers and a first field effect transistor, which is the binning transistor BG. The second device set comprises a serial connection of a second photosensitive diode PD2 having a second detection wavelength range for photogeneration of charge carriers and a second field effect transistor, which is a second transfer gate transistor TG2. The drain of the binning transistor BG and the drain of the second transfer transistor TG2 are electrically tied. A node of the first photosensitive diode PD1, which corresponds to the first semiconductor portion 32 in the exemplary semiconductor structure in FIG. 8, and a node of the second photosensitive diode PD2, which corresponds to the second semiconductor portion 132 in the exemplary semiconductor structure in FIG. 8, are connected to electrical ground. The drain of the binning transistor BG and the drain of the second transfer transistor TG2, which is implemented as a common physical structure of a floating drain region, is electrically connected to the gate of the source follower transistor SF and one of the source of the reset gate transistor RG or the drain of the reset gate transistor RG.

Figure 12:
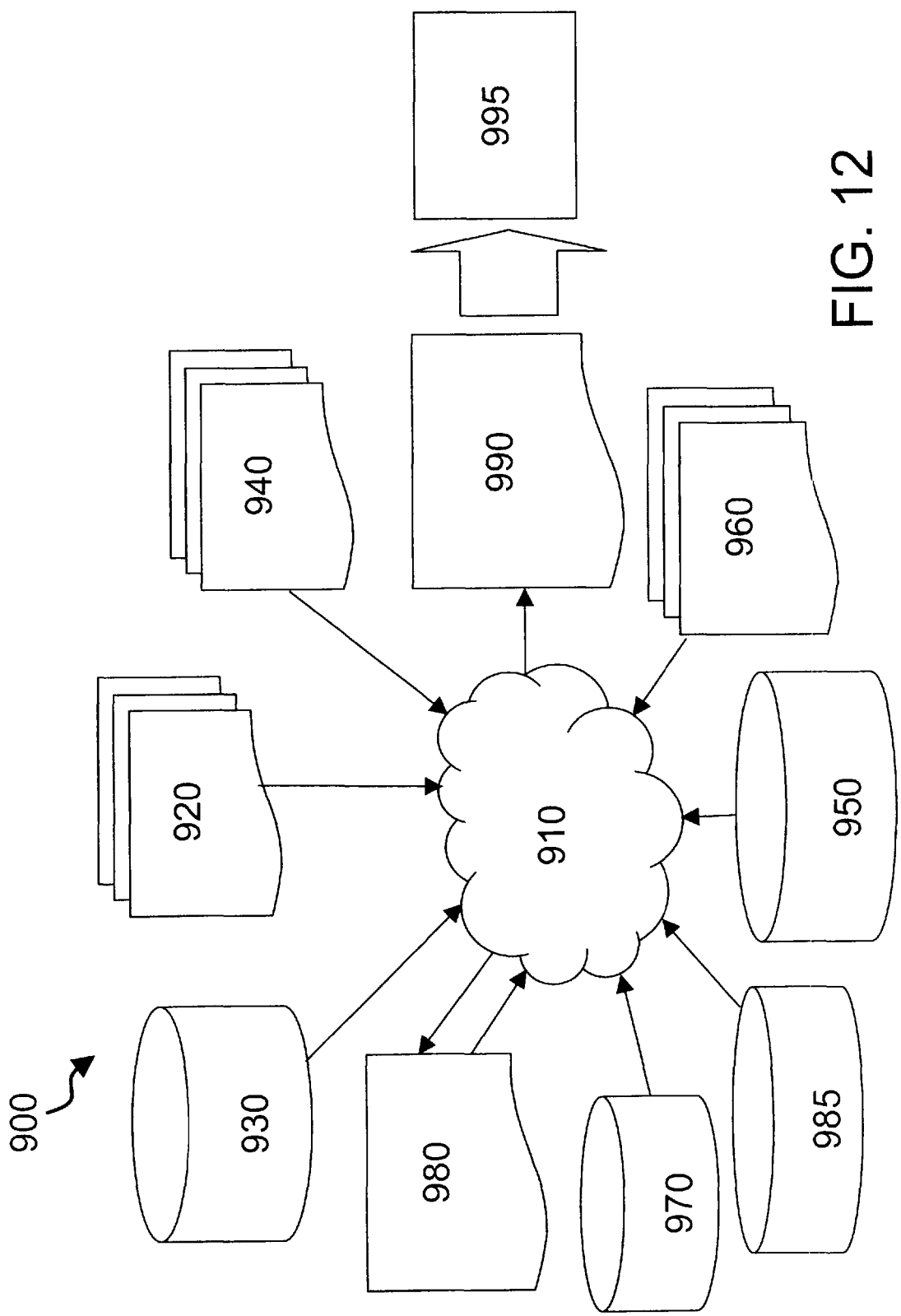
FIG. 12 is a flow diagram of a design process used in semiconductor design and manufacture of the semiconductor structures according to the present invention.

FIG. 12 shows a block diagram of an exemplary design flow 900 used for example, in semiconductor design and manufacturing of the semiconductor circuit according to the present invention. Design flow 900 may vary depending on the type of integrated circuit (IC) being designed. For example, a design flow for building an application specific integrated circuit (ASIC) may differ from a design flow for designing a standard integrated circuit component. Design structure 920 is preferably an input to a design process 910 and may come from an intellectual property (IP) provider, a core developer, or a design company, or may be generated by the operator of a design flow, or may come from other sources.

Design structure 920 comprises an embodiment of present invention as shown in any of FIGS. 1-11 in the form of schematics or hardware description language (HDL; e.g. Verilog, VHDL, C, etc.) The design structure 920 may be contained on one or more machine readable medium. For example, design structure 920 may be a text file or a graphical representation of an embodiment of the invention as shown in FIGS. 1-11.

Design process 910 preferably synthesizes (or translates) an embodiment of the invention as show in FIGS. 1-11 into a netlist 980, where netlist 980 is, for example, a list of metal light shields, wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which the netlist 980 is resynthesized one or more times depending on design specifications and parameters for the circuit.

The design process 910 may include using a variety of inputs; for example, inputs from library elements 930 which may house a set of commonly used elements, circuits, and devices, including models, layouts, and symbolic representations, for a given manufacturing technology (e.g., different technology nodes such as 32 nm, 45 nm, and 90 nm, etc.), design specifications 940, characterization data 950, verification data 960, design rules 970, and test data files 985 (which may include, for example, standard circuit design processes such as timing analysis, verification, design rule checking, place and route operations, etc. One of ordinary skill in the art of integrated circuit design can appreciate the extent of possible electronic design automation tools and applications used in the design process 910 without deviating from the scope and spirit of the present invention. The design structure of the present invention is not limited to any specific design flow.

Design process 910 preferably translates an embodiment of the invention as shown in FIGS. 2-13, along with any additional integrated circuit deign or data (if applicable), into a second design structure 990. Design structure 990 resides on a storage medium in a data format used for the exchange of layout data of integrated circuits and/or symbolic data format (e.g., information stored in GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing though the manufacturing line, and any other data required by a semiconductor manufacturer to produce one of the embodiments of the present invention as shown in FIGS. 1-11. Design structure 990 may then proceed to a stage 995 where, for example, design structure 990 proceeds to tape-out, is released to manufacturing, is released to a mask house, is sent to another design house, is sent back to a customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
    forming a first photosensitive diode in a first semiconductor layer comprising a first semiconductor material in a first semiconductor substrate;
    forming a first metal interconnect structure on said first semiconductor substrate;
    forming a second photosensitive diode in a second semiconductor layer comprising a second semiconductor material in a second semiconductor substrate, wherein said second semiconductor material is different from the first semiconductor material;
    bonding said first semiconductor layer with said second semiconductor layer;
    forming a second metal interconnect structure on said second semiconductor layer after said bonding; and
    forming at least one conductive structure through said second semiconductor layer, wherein said at least one conductive structure abuts said first metal interconnect structure and said second metal interconnect structure.

2. The method of claim 1, wherein an optical path is formed through said second metal interconnect structure, said second photosensitive diode, and said first metal interconnect structure for light having a wavelength within a detection wavelength range of said first photosensitive diode, wherein said first photosensitive diode generates electron-hole pairs upon irradiation of light of said wavelength.

3. The method of claim 2, further comprising forming an optical lens above said second metal interconnect structure and above said optical path.

4. The method of claim 2, further comprising forming a color filter above said second metal interconnect structure and above said optical path.

5. The method of claim 1, further comprising:
forming a first transfer transistor of integral construction with said first photosensitive diode and including a first floating drain in said first semiconductor layer; and
forming a second transfer transistor of integral construction with said second photosensitive diode and including a second floating drain in said second semiconductor layer.

6. The method of claim 1, further comprising:
forming a transfer transistor of integral construction of integral construction with one of said first photosensitive diode and said second photosensitive diode; and
forming a binning transistor in a semiconductor layer containing said transfer transistor.

7. The method of claim 6, further comprising forming a conductive via extending from at least a bottom surface of said second semiconductor layer to at least a top surface of said first semiconductor layer, wherein said conductive via is a portion of an electrically conductive path between said binning transistor and the other of said first photosensitive diode and said second photosensitive diode.

8. The method of claim 1, wherein said second photosensitive diode overlies said first photosensitive diode after bonding.

9. The method of claim 8, wherein said first photosensitive diode comprises a first charge collection well and a first semiconductor portion, wherein said first semiconductor portion abuts a bottom surface of said first charge collection well, and has a doping of a first conductivity type, wherein said first charge collection well comprises said first semiconductor material and has a doping of a second conductivity type, wherein said second conductivity type is the opposite of said first conductivity type.

10. The method of claim 9, wherein said second photosensitive diode comprises a second charge collection well and a second semiconductor portion, wherein said second semiconductor portion abuts a bottom surface of said second charge collection well, includes a second semiconductor material, and has a doping of said first conductivity type, wherein said second charge collection well comprises said second semiconductor material and has a doping of said second conductivity type.

11. The method of claim 1, wherein said first semiconductor material has a first band gap width and said second semiconductor material has a second band gap width, and wherein said second band gap width is different from said first band gap width.

12. The semiconductor structure of claim 1, wherein said at least one conductive structure extends at least from an uppermost surface of said second semiconductor substrate at least to a bottommost surface of said second semiconductor substrate.

13. A semiconductor circuit embodied in a semiconductor structure, said semiconductor circuit comprising a parallel connection of a first device set and a second device set, wherein said first device set comprises a serial connection of a first photosensitive diode having a first detection wavelength range for photogeneration of charge carriers and a first field effect transistor, and wherein said second device set comprises a serial connection of a second photosensitive diode having a second detection wavelength range for photogeneration of charge carriers and a second field effect transistor, wherein a drain of said first field effect transistor and a drain of said second field effect transistor are electrically tied, wherein a node of said first photosensitive diode and a node of said second photosensitive diode are connected to electrical ground, and wherein said first detection wavelength range is different from said second detection wavelength range, wherein said first photosensitive diode is located in a first semiconductor layer comprising a first semiconductor material in a first semiconductor substrate, wherein said second photosensitive diode is located in a second semiconductor layer comprising a second semiconductor material in a second semiconductor substrate, wherein said second semiconductor material is different from the first semiconductor material, and wherein said semiconductor structure further includes at least one conductive structure through said second semiconductor layer, wherein said at least one conductive structure provides an electrically conductive path between said first photosensitive diode and said second photosensitive diode through said second semiconductor substrate.

14. The semiconductor circuit of claim 13, further comprising a source follower transistor, wherein said drain of said first field effect transistor and said drain of said second field effect transistor are directly connected to a gate of said source follower transistor.

15. The semiconductor circuit of claim 14, further comprising a reset gate transistor, wherein one of a source of said reset gate transistor and a drain of said reset gate transistor is directly connected to said drain of said first field effect transistor and said drain of said second field effect transistor, and the other of said source of said reset gate transistor and said drain of said reset gate transistor is connected to a power supply source.

16. The semiconductor circuit of claim 14, further comprising a row select transistor in a series connection with said source follower transistor, wherein one of a source of said source follower transistor and a drain of said source follower transistor is connected to a source or a drain of said row select transistor, wherein the other of said source of said source follower transistor and said drain of said source follower transistor is connected to a power supply source.

17. The semiconductor circuit of claim 13, wherein said semiconductor structure further comprises:
a first metal interconnect structure located on a first semiconductor substrate that includes said first photosensitive diode; and
a second metal interconnect structure located on said second semiconductor layer and not contacting said first semiconductor substrate.

18. The semiconductor circuit of claim 17, wherein said at least one conductive structure that abuts said first metal interconnect structure and said second metal interconnect structure.

19. The semiconductor circuit of claim 13, wherein said at least one conductive structure extends at least from an uppermost surface of said second semiconductor substrate at least to a bottommost surface of said second semiconductor substrate.

20. The semiconductor circuit of claim 13, wherein said first photosensitive diode comprises a first charge collection well and a first semiconductor portion, wherein said first semiconductor portion abuts a bottom surface of said first charge collection well, and has a doping of a first conductivity type, wherein said first charge collection well comprises said first semiconductor material and has a doping of a second conductivity type, wherein said second conductivity type is the opposite of said first conductivity type.

* * * * *